United States Patent
Park et al.

(10) Patent No.: US 7,684,268 B2
(45) Date of Patent: Mar. 23, 2010

(54) SEMICONDUCTOR MEMORY DEVICE

(75) Inventors: Sang-Il Park, Kyoungki-do (KR); Saeng-Hwan Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 149 days.

(21) Appl. No.: 11/819,789

(22) Filed: Jun. 29, 2007

(65) Prior Publication Data
US 2008/0080288 A1 Apr. 3, 2008

(30) Foreign Application Priority Data
Sep. 28, 2006 (KR) .................... 10-2006-0095189

(51) Int. Cl.
*G11C 29/00* (2006.01)
(52) U.S. Cl. .................. 365/201; 365/226; 365/203; 365/229; 365/185.25
(58) Field of Classification Search ................ 365/226, 365/189.09, 233, 203, 183, 189.11, 230.01, 365/233.15, 222
See application file for complete search history.

(56) References Cited

U.S. PATENT DOCUMENTS

| | | | | |
|---|---|---|---|---|
| 5,510,749 | A * | 4/1996 | Arimoto | 327/546 |
| 5,604,707 | A * | 2/1997 | Kuge et al. | 365/226 |
| 6,504,783 | B2 | 1/2003 | Jo | |
| 2005/0243620 | A1 * | 11/2005 | Imamiya et al. | 365/202 |

FOREIGN PATENT DOCUMENTS

| | | |
|---|---|---|
| JP | 2002-170387 | 6/2002 |
| JP | 2003-091998 | 3/2003 |
| KR | 10-0164814 B1 | 9/1998 |
| KR | 10-2001-0005090 | 1/2001 |
| KR | 10-2001-0069001 A | 7/2001 |
| KR | 10-2002-0017393 A | 3/2002 |

OTHER PUBLICATIONS

Korean Notice of Allowance issued in Korean Patent Application No. Kr 10-2006-0095189, dated on Mar. 10, 2008.
Korean Office Action, with English translation, issued in Korean Patent Application No. KR 10-2006-0095189, mailed Oct. 30, 2007.

* cited by examiner

*Primary Examiner*—Anh Phung
*Assistant Examiner*—Tha-O Bui
(74) *Attorney, Agent, or Firm*—IP & T Law Firm PLC

(57) ABSTRACT

A semiconductor memory device includes: a plurality of cell array blocks; a boosted voltage driving unit for selectively supplying a boosted voltage to the cell array blocks; and a controller controlling a driving operation of the boosted voltage driving unit in response to a cell array block select signal.

20 Claims, 4 Drawing Sheets

SEMICONDUCTOR MEMORY DEVICE

CROSS-REFERENCE TO RELATED APPLICATIONS

The present invention claims priority of Korean patent application number 10-2006-0095189, filed on Sep. 28, 2006, which is incorporated by reference in its entirety.

BACKGROUND OF THE INVENTION

The present invention relates to semiconductor design technology, and more particularly, to a power supply controller of a cell array block in a semiconductor memory device.

In general, an operational mode of a semiconductor memory device such as a dynamic random access memory (DRAM) or the like is divided into two modes, of which one is an active mode and the other is a stand-by mode. When the semiconductor memory device is in the active mode, circuits in a chip operate to output requested data to the outside or to receive required data thereinto. Meanwhile, when the semiconductor memory device is in the stand-by mode, all current paths of circuits are cut off to minimize power consumption in the chip except for minimum number of circuits that are enabled to enter the active mode.

However, when the semiconductor memory device keeps in the stand-by mode for a long time, the circuits, which are enabled to enter the active mode, consume unnecessary current continuously. In particular, off leakage current mainly accounts for such an unnecessary current consumption in a transistor that uses a boosted voltage VPP with high voltage level as a bias voltage.

In addition, a transistor using the boosted voltage VPP, which is applied to an unselected cell array block in a bank even during the active mode, as the bias voltage also generates the large amount of off leakage current undesirably as similar to the above. Herein, the cell array block is selected by a cell array select signal generated corresponding to a column address. Since the boosted voltage VPP has a high voltage level, high electric field is applied across a source and a drain of a transistor, which causes the large amount of off leakage current to be generated. Furthermore, this phenomenon of the off leakage current also occurs during a self-refresh mode including a stand-by mode.

FIG. 1 is a block diagram of a conventional cell array block.

Referring to FIG. 1, the conventional cell array block includes a plurality of matrix blocks 11 having a plurality of memory cells, a plurality of sub hall regions 10, and a plurality of X-decoders 12. The sub hall region 10 is provided with a main word line driver, a bit line sense amplifier (BLSA) driver, and a bit line isolation transistor.

The boosted voltage VPP is applied to the matrix blocks 11, the sub hall regions 10, and the X-decoders 12, respectively. Also, the boosted voltage VPP is used as a substrate bias voltage VBB.

Here, a supply mechanism of the boosted voltage VPP will be described below by using, for example, a generator for generating bit line isolation transistor (BLIT) control signals BISHB/BISH (hereinafter, referred to as 'BLIT control signal generator' for simplicity) which is provided in the sub hall region 10. Although this boosted voltage supply mechanism is also applied to transistors (drivers) using the boosted voltage VPP as well as the BLIT control signal generator, following illustration focuses on the BLIT control signal generator for convenience of description.

FIG. 2 is a circuit diagram of the BLIT control signal generator.

Referring to FIG. 2, the BLIT control signal generator has an inverter structure provided with a PMOS transistor P1 and an NMOS transistor N1.

When an input signal of a bit line isolation bar signal BISHB is at a logic low level, the PMOS transistor P1 is turned on to output a bit line isolation signal BISH by the boosted voltage VPP. The boosted voltage VPP is also applied as the substrate bias voltage.

This is the same in both the active mode and the stand-by mode. In these modes, high electric field is applied across the source and the drain of the PMOS transistor P1, causing the large amount of off leakage current to be generated.

That is, great amount of off leakage current is generated because the boosted voltage with high voltage level is applied to a cell array block which is not selected by a cell array block select signal during the active mode or the stand-by mode. As described above, the cell array block select signal is generated by a column address signal, and selects some of the plurality of cell array blocks.

Therefore, it is required a control circuit that can apply a voltage having a voltage level lower than that of the boosted voltage VPP to only the cell array block that is not selected by the cell array block select signal. Here, it is noticed that an extremely low voltage cannot be used as the voltage to be applied to the unselected cell array block because the extremely low voltage must be raised to a level of the boosted voltage VPP when a corresponding cell array block is selected. That is, a response time must be delayed when using the voltage extremely lower than the boosted voltage VPP. Thus, the voltage to be applied to the unselected cell array block must have a predetermined voltage level in consideration of both the off leakage current and the response time.

SUMMARY OF THE INVENTION

Embodiments of the present invention are directed to providing a semiconductor memory device for reducing the amount of off leakage current of an unselected cell array block by applying a low voltage to the unselected cell array block, which is smaller than a voltage applied to a selected cell array block.

Embodiments of the present invention are also directed to providing a semiconductor memory device for reducing the amount of off leakage current of an unselected cell array block by applying a low voltage to the unselected cell array block, which is smaller than a voltage applied to a cell array block selected during a stand-by mode or a self-refresh mode.

In accordance with the first aspect of the present invention, there is provided a semiconductor memory device, including: a plurality of cell array blocks; a boosted voltage driving unit for selectively supplying a boosted voltage to the cell array blocks; and a controller controlling a driving operation of the boosted voltage driving unit in response to a cell array block select signal.

In accordance with the second aspect of the present invention, there is provided a semiconductor memory device, including: a plurality of cell array blocks; a plurality of power supply lines provided for each of the cell array blocks correspondingly; a plurality of power supply voltage drivers provided for each of the power supply lines correspondingly to supply a power supply voltage to the power supply lines; and a plurality of boosted voltage drivers provided for each of the power supply lines correspondingly to supply a boosted voltage to the power supply lines in response to a cell array block select signal.

In accordance with the third aspect of the present invention, there is provided a semiconductor memory device, including:

a plurality of cell array blocks; a plurality of power supply lines provided for each of the cell array blocks correspondingly; a plurality of power supply voltage drivers provided for each of the power supply lines correspondingly to supply a power supply voltage to the power supply lines; and a plurality of boosted voltage drivers provided for each of the power supply lines correspondingly to supply a boosted voltage to the power supply lines in response to a cell array block select signal and a control signal indicating a stand-by mode or a self-refresh mode.

In accordance with the fourth aspect of the present invention, there is provided a semiconductor memory device, including: a plurality of cell array blocks; a plurality of power supply lines provided for each of the cell array blocks correspondingly; a plurality of power supply voltage drivers provided for each of the power supply lines correspondingly to supply a power supply voltage to the power supply lines; a plurality of boosted voltage drivers provided for each of the power supply lines correspondingly to supply a boosted voltage to the power supply lines; and a plurality of controllers provided for each of the boosted voltage drivers correspondingly to control driving operations of the boosted voltage drivers.

The present invention provides two embodiments.

In a first embodiment, a boosted voltage VPP is applied to a selected cell array block regardless of a specific mode of a semiconductor memory device, whereas a power supply voltage VDD lower than the boosted voltage VPP is applied to unselected memory cell array blocks.

In a second embodiment, the boosted voltage VPP is applied to a cell array block selected during an active mode or a self-refresh mode, whereas the power supply voltage VDD lower than the boosted voltage VPP is applied to unselected memory cell array blocks.

Accordingly, it is possible to reduce the amount of off leakage current in accordance with the two embodiments.

DESCRIPTION OF SPECIFIC EMBODIMENTS

Hereinafter, a semiconductor memory device in accordance with the present invention will be described in detail referring to the accompanying drawings.

Figure 3:
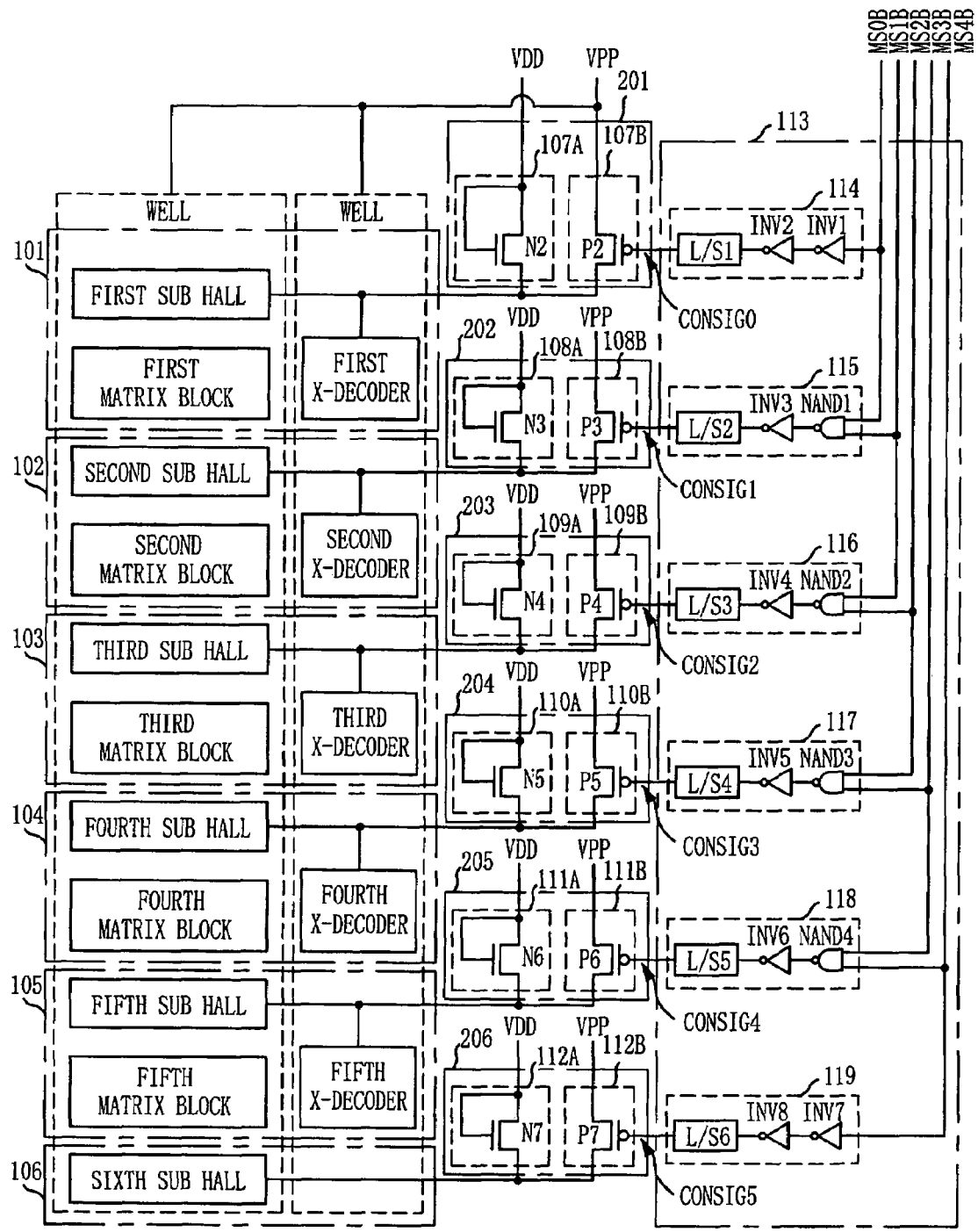
FIG. 3 is a block diagram illustrating a power supply controller of a cell array block in accordance with a first embodiment of the present invention.

FIG. 3 is a block diagram illustrating a power supply controller of a cell array block in accordance with a first embodiment of the present invention.

Referring to FIG. 3, the power supply controller of the cell array block includes a plurality of cell array blocks 101 to 106, a plurality of power supply lines corresponding to the plurality of cell array blocks 101 to 106, a plurality of boosted voltage driving units 201 to 206, and a controller.

The power supply lines are disposed between the cell array blocks 101 to 106 and the boosted voltage driving units 201 to 206. Each of the boosted voltage driving units 201 to 206 supplies a boosted voltage VPP to the cell array blocks 101 to 106, respectively. The controller 113 controls driving operations of the boosted voltage driving units 201 to 206 in response to first to fifth cell array block select signals MS0B to MS4B.

Herein, each of the plurality of boosted voltage driving units 201 to 206 includes a clamping circuit for supplying a clamped voltage, which is lower than the boosted voltage VPP, to unselected cell array blocks 101 to 106 in response to the first to fifth cell array block select signals MS0B to MS4B. Each of the plurality of boosted voltage driving units 201 to 206 includes a voltage down converter for lowering the boosted voltage VPP to apply the lowered voltage to the unselected cell array blocks 101 to 106 in response to the first to fifth cell array block select signals MS0B to MS4B.

The clamping circuit and the voltage down converter, which correspond to reference numerals 107A to 112A, are provided in the boosted voltage driving unit so as to apply the voltage lower than the boosted voltage VPP to the unselected cell array blocks 101 to 106.

In more detail, the plurality of boosted voltage driving units 201 to 206 include a plurality of power supply voltage drivers 107A to 112A corresponding to the power supply lines to supply a power supply voltage VDD to the power supply lines, and a plurality of boosted voltage drivers 107B to 112B corresponding to the power supply lines to supply the boosted voltage VPP to the power supply lines.

Each of the cell array blocks 101 to 106 includes a matrix block having a memory cell singly or in plurality, a sub hall region and an X-decoder. The sub hall region is provided with a main word driver, a bit line sense amplifier (BLSA) driver, a bit line isolation transistor (BLIT) control signal generator, and the like.

The cell array blocks 101 to 106 use the boosted voltage VPP as a substrate bias voltage, and thus these are regions where the boosted voltage VPP is much consumed generally.

The sub hall region has an effect on adjacent matrix blocks in general. For example, the second sub hall region has an effect on both the first and second matrix blocks but it is shown that one matrix block and one sub hall region are provided in each of the cell array blocks 101 to 106 for convenience of description in the embodiment.

The BLIT control signal generator provided in the sub hall region receives a source power through the boosted voltage driving units 201 to 206. The boosted voltage VPP is applied to a well of the BLIT control signal generator without passing through the boosted voltage driving units 201 to 206.

The controller 113 includes first to sixth control signal generating circuits 114 to 119 corresponding to the plurality of booted voltage drivers 107B to 112B to control driving operations of the boosted voltage drivers 107B to 112B. In detail, the controller 113 includes the first control signal generating circuit 114 for generating a first control signal CONSIG0 to drive the first boosted voltage driver 107B in response to the first cell array select signal MS0B, the second control signal generating circuit 115 for generating a second control signal CONSIG1 to drive the second boosted voltage driver 108B in response to the first and second cell array select signals MS0B and MS1B, the third control signal generating circuit 116 for generating a third control signal CONSIG2 to drive the third boosted voltage driver 109B in response to the second and third cell array select signals MS1B and MS2B, the fourth control signal generating circuit 117 for generating a fourth control signal CONSIG3 to drive the fourth boosted voltage driver 110B in response to the third and fourth cell array select signals MS2B and MS3B, the fifth control signal generating circuit 118 for generating a fifth control signal CONSIG4 to drive the fifth boosted voltage driver 111B in response to the fourth and fifth cell array select signals MS3B and MS4B, and the sixth control signal generating circuit 119 for generating a sixth control signal CONSIG5 to drive the sixth boosted voltage driver 112B in response to the fifth cell array select signal MS4B.

In more detail, the first control signal generating circuit 114 includes first and second inverters INV1 and INV2 and a first level shifter L/S1. The first and second inverters INV1 and INV2 buffer the first cell array select signal MS0B. The first level shifter L/S1 shifts a level of an output signal of the second inverter INV2 to output the shifted signal as the first control signal CONSIG0.

The second control signal generating circuit 115 is provided with a first NAND gate NAND1, a third inverter INV3 and a second level shifter L/S2. The first NAND gate NAND1 performs a NAND operation on the first and second cell array select signals MS0B and MS1B. The third inverter INV3 inverts an output signal of the first NAND gate NAND1. The second level shifter L/S2 shifts a level of an output signal of the third inverter INV3 to output the shifted signal as the second control signal CONSIG1.

The third control signal generating circuit 116 is provided with a second NAND gate NAND2, a fourth inverter INV4 and a third level shifter L/S3. The second NAND gate NAND2 performs a NAND operation on the second and third cell array select signals MS1B and MS2B. The fourth inverter INV4 inverts an output signal of the second NAND gate NAND2. The third level shifter L/S3 shifts a level of an output signal of the fourth inverter INV4 to output the shifted signal as the third control signal CONSIG2.

The fourth control signal generating circuit 117 is provided with a third NAND gate NAND3, a fifth inverter INV5 and a fourth level shifter L/S4. The third NAND gate NAND3 performs a NAND operation on the third and fourth cell array select signals MS2B and MS3B. The fifth inverter INV5 inverts an output signal of the third NAND gate NAND3. The fourth level shifter L/S4 shifts a level of an output signal of the fifth inverter INV5 to output the shifted signal as the fourth control signal CONSIG3.

The fifth control signal generating circuit 118 is provided with a fourth NAND gate NAND4, a sixth inverter INV6 and a fifth level shifter L/S5. The fourth NAND gate NAND4 performs NAND operation on the fourth and fifth cell array select signals MS3B and MS4B. The sixth inverter INV6 inverts an output signal of the fourth NAND gate NAND4. The fifth level shifter L/S5 shifts a level of an output signal of the sixth inverter INV6 to output the shifted signal as the fifth control signal CONSIG4.

The sixth control signal generating circuit 119 is provided with seventh and eighth inverters INV7 and INV8 for buffering the fifth cell array select signal MS4B, and a sixth level shifter L/S6 for shifting a level of an output signal of the eighth inverter INV8 to output the shifted signal as the sixth control signal CONSIG5.

The first to sixth control signals CONSIG0 to CONSIG5 are generated as above to acquire logic levels corresponding to the logic levels of the cell array block select signals MS0B to MS4B, and thus the first to sixth boosted voltage drivers 107B to 112B operate.

The second through fifth control signal generating circuits 115 to 118 use two cell array select signals because the sub hall region is disposed between adjacent two matrix blocks to control operations of the two adjacent matrix blocks.

The first to sixth boosted voltage drivers 107B to 112B are circuits for driving main circuits in the cell array blocks 101 to 106 by applying the boosted voltage VPP to the selected cell array blocks 101 to 106. To this end, the boosted voltage drivers 107B to 112B are configured with PMOS transistors P2 to P7 using the first to sixth control signals CONSIG0 to CONSIG5 outputted from the controller 113 as gate input signals, of which sources are connected to a boosted voltage terminal and drains are connected to the power supply line.

The boosted voltage VPP is used as a bias voltage of a substrate where the cell array blocks 101 to 106 are provided.

Thereafter, the power supply voltage drivers 107A to 112A apply the power supply voltage VDD to unselected cell array blocks 101 to 106.

To this end, the power supply voltage drivers 107A to 112A are configured with NMOS transistors N2 to N7 of which sources and gates are commonly connected to a power supply terminal, and drains are connected to the power supply line.

An operation of the power supply controller of the cell array blocks 101 to 106 will be described below. For convenience of description, it is assumed that the first and second cell array blocks 101 and 102 are selected by the first to fifth cell array block select signals MS0B to MS4B, and the other cell array blocks 103 to 106 are not selected.

The first and second control signals CONSIG0 and CONSIG1 of the first and second control signal generating circuits 114 and 115 become a logic low level in response to first and second cell array block select signals MS0B to MS1B so that the first and second boosted voltage drivers 107B and 108B operate. Accordingly, the boosted voltage VPP is applied to the first and second cell array blocks 101 and 102, thereby operating various kinds of circuits, e.g., circuits using the boosted voltage VPP as a driving voltage, provided in the corresponding cell array blocks 101 and 102.

Meanwhile, the third to sixth control signals CONSIG2 to CONSIG5 of the third to sixth control signal generating circuits 116 to 119 become a logic high level by the third to fifth cell array block select signals MS2B to MS4B so that the corresponding boosted voltage drivers 109B to 112B do not operate. Therefore, the output voltages of the power supply voltage drivers 109A to 112A are applied to the corresponding cell array blocks 103 to 106. At this point, since the corresponding cell array blocks 103 to 106 operate in the same manner as the stand-by mode, they do not erroneously operate even if a voltage, e.g., the power supply voltage, lower than the boosted voltage VPP is applied.

In summary, the boosted voltage VPP is applied to the selected cell array blocks 101 and 102, whereas the power supply voltage VDD is applied to the unselected cell array blocks 103 to 106. This makes it possible to reduce the amount of off leakage current in the inventive power supply controller applying the power supply voltage VDD to the unselected cell array blocks 103 to 106, compared to the prior art case where the boosted voltage VPP is applied to the unselected cell array blocks 103 to 106.

In the embodiment as described above, the power supply control method of the cell array block has been illustrated regardless of a specific operation mode of a semiconductor memory device. Specifically, the power supply control method of the cell array block during a stand-by mode will be described below.

Figure 4:
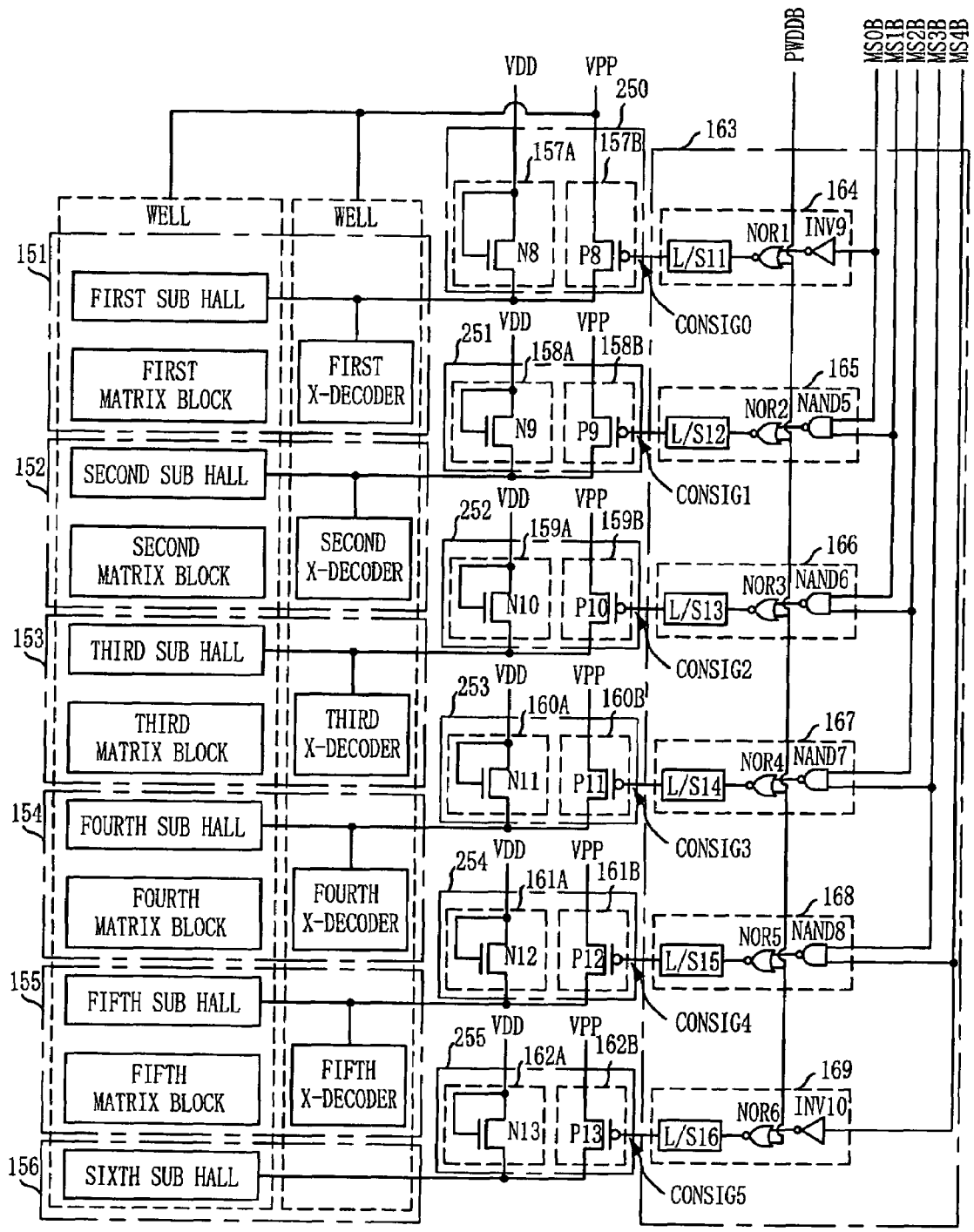
FIG. 4 is a block diagram illustrating a power supply controller of a cell array block during a stand-by mode or a self-refresh mode in accordance with a second embodiment of the present invention.

FIG. 4 is a block diagram illustrating a power supply controller of a cell array block during a stand-by mode or a self-refresh mode in accordance with a second embodiment of the present invention.

Referring to FIG. 4, during the stand-by mode or the self-refresh mode, the power supply controller of the cell array block in accordance with the second embodiment includes a plurality of cell array blocks 151 to 156, a plurality of boosted voltage driving units 250 to 255 supplying a boosted voltage VPP to the plurality of cell array blocks 151 to 156, and a controller 163 controlling driving operations of the boosted voltage driving units 250 to 255 in response to first to fifth cell array block select signals MS0B to MS4B and a power down mode signal PWDDB. Hereinafter, the power down mode signal PWDDB, which controls the self-refresh mode or the stand-by mode, will indicate the stand-by mode but it is noted that it includes the self-refresh mode.

Here, each of the plurality of boosted voltage driving units 250 to 255 includes a clamping circuit for providing a clamped voltage, which is lower than the boosted voltage VPP, to unselected cell array blocks 151 to 156 in response to the cell array block select signals MS0B to MS4B. Each of the plurality of boosted voltage driving units 250 to 255 includes a voltage down converter for lowering the boosted voltage VPP to apply the lowered voltage to the unselected cell array blocks 151 to 156 in response to the first to fifth cell array block select signals MS0B to MS4B during the stand-by mode or the self-refresh mode.

The clamping circuit and the voltage down converter, which correspond to reference numerals 157A to 162A of FIG. 4, are provided in the boosted voltage driving unit so as to apply the voltage lower than the boosted voltage VPP to the unselected cell array blocks 151 to 156.

In more detail, the power supply controller in accordance with the another embodiment of the present invention includes the plurality of cell array blocks 151 to 156, a plurality of power supply lines corresponding to the plurality of cell array blocks 151 to 156, a plurality of power supply voltage drivers 157A to 162A corresponding to the power supply lines to supply a power supply voltage VDD to the power supply lines, a plurality of boosted voltage drivers 157B to 162B corresponding to the power supply lines to supply the boosted voltage VPP to the power supply lines, and a plurality of controllers 164 to 169 corresponding to the plurality of booted voltage drivers 157B to 162B to control driving operations of the boosted voltage drivers 157B to 162B. Herein, each of the power supply voltage drivers 157A to 162A and each of the boosted voltage drivers 157B to 162B are included in the corresponding boosted voltage driving unit 250 to 255. The plurality of power supply lines are disposed between the cell array blocks 151 to 156 and the boosted voltage driving units 250 to 255.

Each of the cell array blocks 151 to 156 includes a matrix block having a memory cell singly or in a plurality, a sub hall region and an X-decoder. The sub hall region is provided with a main word driver, a BLSA driver, a BLIT control signal generator, and the like.

The cell array blocks 151 to 156 use the boosted voltage VPP as a substrate bias voltage, and thus these are regions where the boosted voltage VPP is much consumed generally.

The sub hall region has an effect on adjacent matrix blocks in general. For example, the second sub hall region has an effect on both the first and second matrix blocks but it is shown that one matrix block and one sub hall region are provided in each of the cell array blocks 151 to 156 in the embodiment for convenience of description.

The BLIT control signal generator provided in the sub hall region receives a source power through the boosted voltage driving units 250 to 255. The boosted voltage VPP is applied to a well of the BLIT control signal generator without passing through the boosted voltage driving units 250 to 255.

The controller 163 applies the power supply voltage VDD having lower voltage level than the boosted voltage VPP to the cell array blocks 151 to 156 when a memory device enters the stand-by mode or the self-refresh mode. The controller 163 includes a first control signal generating circuit 164 for generating a first control signal CONSIG0 to drive a first boosted voltage driver 157B in response to the first cell array select signal MS0B and the power down mode signal PWDDB, a second control signal generating circuit 165 for generating a second control signal CONSIG1 to drive a second boosted voltage driver 158B in response to the first and second cell array select signals MS0B and MS1B and the power down mode signal PWDDB, a third control signal generating circuit 166 for generating a third control signal CONSIG2 to drive a third boosted voltage driver 159B in response to the second and third cell array select signals MS1B and MS2B and the power down mode signal PWDDB, a fourth control signal generating circuit 167 for generating a fourth control signal CONSIG3 to drive a fourth boosted voltage driver 160B in response to the third and fourth cell array select signals MS2B and MS3B and the power down mode signal PWDDB, a fifth control signal generating circuit 168 for generating a fifth control signal CONSIG4 to drive a fifth boosted voltage driver 161B in response to the fourth and fifth cell array select signals MS3B and MS4B and the power down mode signal PWDDB, and a sixth control signal generating circuit 169 for generating a sixth control signal CONSIG5 to drive a sixth boosted voltage driver 162B in response to the fifth cell array select signal MS4B and the power down mode signal PWDDB.

In more detail, the first control signal generating circuit 164 is provided with a first inverter INV9 for inverting the first cell array select signal MS0B, a first NOR gate NOR1 for performing a NOR operation on an output signal of the first inverter INV9 and the power down mode signal PWDDB, and a first level shifter L/S11 for shifting a level of an output signal of the first NOR gate NOR1 to output the shifted signal as the first control signal CONSIG0.

The second control signal generating circuit 165 is provided with a first NAND gate NAND5 for performing a NAND operation on the first and second cell array select signals MS0B and MS1B, a second NOR gate NOR2 for performing a NOR operation on an output signal of the first NAND gate NAND5 and the power down mode signal PWDDB, and a second level shifter L/S12 for shifting a level of an output signal of the second NOR gate NOR2 to output the shifted signal as the second control signal CONSIG1.

The third control signal generating circuit 166 is provided with a second NAND gate NAND6 for performing a NAND operation on the second and third cell array select signals MS1B and MS2B, a third NOR gate NOR3 for performing a NOR operation on an output signal of the second NAND gate NAND6 and the power down mode signal PWDDB, and a third level shifter L/S13 for shifting a level of an output signal of the NOR gate NOR3 to output the shifted signal as the third control signal CONSIG2.

The fourth control signal generating circuit 167 is provided with a third NAND gate NAND7 for performing a NAND operation on the third and fourth cell array select signals MS2B and MS3B, a fourth NOR gate NOR4 for performing a NOR operation on an output signal of the third NAND gate NAND7 and the power down mode signal PWDDB, and a fourth level shifter L/S14 for shifting a level of an output signal of the fourth NOR gate NOR4 to output the shifted signal as the fourth control signal CONSIG3.

The fifth control signal generating circuit 168 is provided with a fourth NAND gate NAND8 for performing a NAND operation on the fourth and fifth cell array select signals MS3B and MS4B, a fifth NOR gate NOR5 for performing a NOR operation ono an output signal of the fourth NAND gate NAND8 and the power down mode signal PWDDB, and a fifth level shifter L/S15 for shifting a level of an output signal of the fifth NOR gate NOR5 to output the shifted signal as the fifth control signal CONSIG4.

The sixth control signal generating circuit 169 is provided with a second inverter INV10 for inverting the fifth cell array select signal MS4B, a sixth NOR gate NOR6 for performing a NOR operation on an output signal of the second inverter INV10 and the power down mode signal PWDDB, and a sixth level shifter L/S16 for shifting a level of an output signal of the sixth NOR gate NOR6 to output the shifted signal as the sixth control signal CONSIG5.

The first to sixth control signals CONSIG0 to CONSIG5 are generated as above to acquire logic levels corresponding to the logic levels of the power down mode signal PWDDB and the cell array block select signals MS0B to MS4B, and thus the boosted voltage drivers 157B to 162B operate.

The second to fifth control signal generating circuits 165 to 168 use two cell array select signals because the sub hall region is disposed between adjacent two matrix blocks to control operations of the two adjacent matrix blocks.

The boosted voltage drivers 157B to 162B are circuits for driving main circuits in the cell array blocks 151 to 156 by applying the boosted voltage VPP to the selected cell array blocks 151 to 156. To this end, the boosted voltage drivers 157B to 162B are configured with PMOS transistors P8 to P13 using the first to sixth control signals CONSIG0 to CONSIG5 outputted from the controller 163 as gate input signals, of which sources are connected to the boosted voltage terminal and drains are connected to the power supply line.

The boosted voltage VPP is used as a bias voltage of a substrate where the cell array blocks 151 to 156 are provided.

Thereafter, the power supply voltage drivers 157A to 162A apply the power supply voltage VDD to unselected cell array blocks 151 to 156.

To this end, the power supply voltage drivers 157A to 162A are configured with NMOS transistors N8 to N13 of which sources and gates are commonly connected to a power supply terminal, and drains are connected to the power supply line.

An operation of the power supply controller of the cell array block 151 to 156 may be mainly divided into two modes, of which one is an active mode and the other is a stand-by mode including a self-refresh mode.

That is, levels of voltages applied to the cell array blocks 151 to 156 primarily change depending on a logic level of the power down mode signal PWDDB. Afterwards, the levels of the voltages applied to the cell array blocks 151 to 156 secondarily change in response to the cell array block select signals MS0B to MS4B. Such an operation is determined by the first to sixth control signals CONSIG0 to CONSIG5 of the controller 163.

For example, when a semiconductor memory device enters the active mode, the power down mode signal PWDDB becomes a logic high level. Accordingly, the first to sixth control signals CONSIG0 to CONSIG5 of the controller 163 become a logic low level to apply the boosted voltage VPP to the cell array blocks 151 to 156.

That is, when the semiconductor memory device is in the active mode, the boosted voltage VPP is applied to all cell array blocks 151 to 156 regardless of selection or unselection of the cell array blocks 151 to 156 by the cell array block select signals MS0B to MS4B.

Alternatively, when the semiconductor memory device enters the stand-by mode or the self-refresh mode, the power down mode signal PWDDB becomes a logic low level. Only the first cell array block select signal MS0B becomes a logic low level to select the first cell array block 151.

In response to the power down mode signal PWDDB and the first cell array block select signal MS0B, only the first control signal CONSIG0 becomes a logic low level, and other control signals CONSIG1 to CONSIG5 become a logic high level.

Therefore, the boosted voltage VPP is applied to only the selected first cell array block 151, whereas the power supply voltage VDD lower than the boosted voltage VPP is applied to the other cell array blocks 152 to 156 which are not selected.

That is, in this case, the boosted voltage VPP is applied to the whole cell array blocks 151 to 156 during the active mode. During the stand-by mode or the self-refresh mode, the boosted voltage VPP is applied to the cell array block 151 selected by the cell array block select signal MS0B, whereas the power supply voltage VDD is applied to the unselected cell array blocks 152 to 156.

Figure 5:
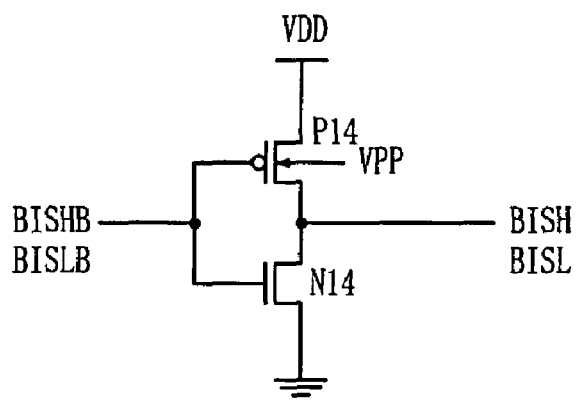
FIG. 5 is a circuit diagram illustrating a BLIT control signal generator among internal circuits of a cell array block when a power supply voltage is applied to the cell array block in the first and second embodiments of FIGS. 3 and 4.

FIG. 5 is a circuit diagram illustrating a BLIT control signal generator among internal circuits of a cell array block when the power supply voltage VDD is applied to the cell array blocks in the embodiments of FIGS. 3 and 4. Here, the BLIT control signal generator, which operates using the boosted voltage as a driving voltage, is a representative circuit among various circuits using the boosted voltage VPP as the driving voltage in the cell array block.

Figure 1:
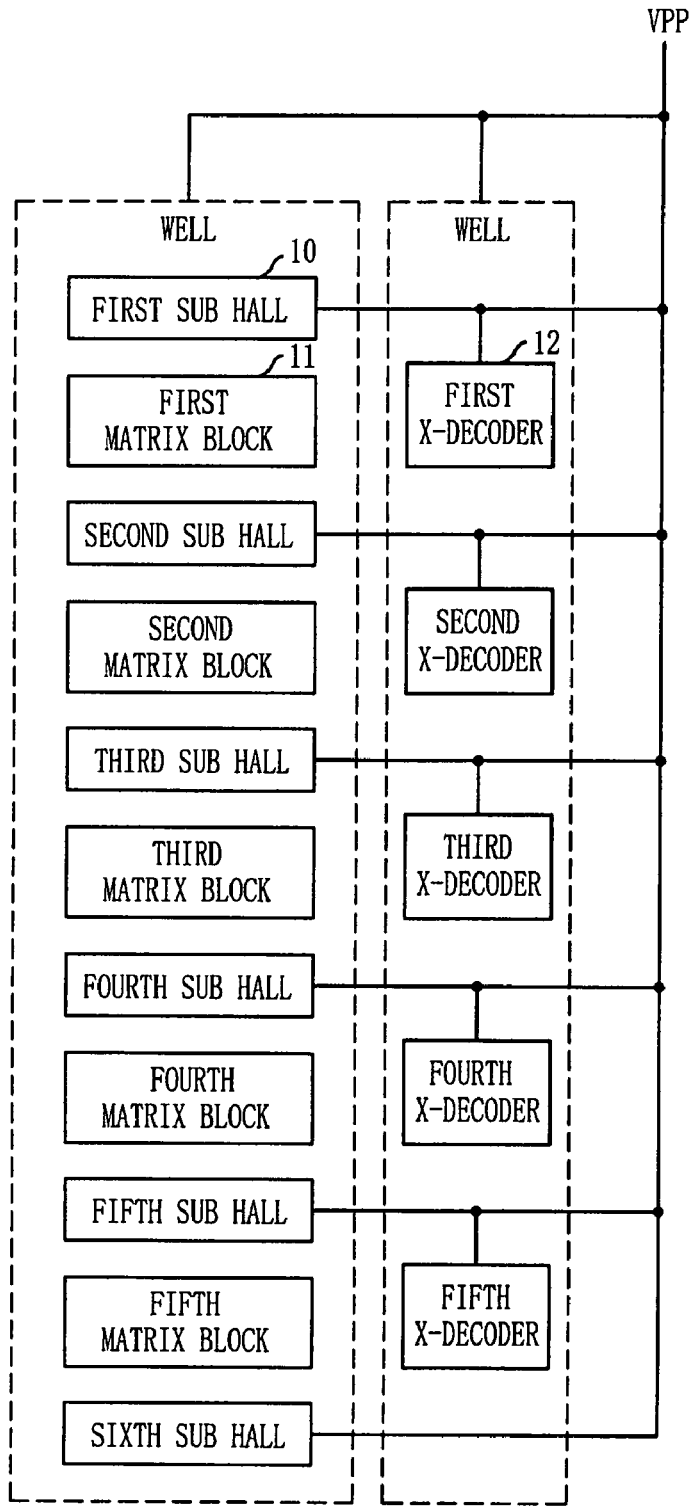
FIG. 1 is a block diagram of a conventional cell array block.
Figure 2:
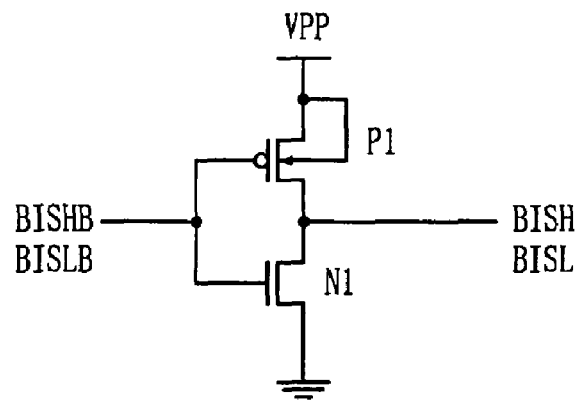
FIG. 2 is a circuit diagram of a bit line isolation transistor (BLIT) control signal generator.

Referring to FIG. 5, the BLIT control signal generator has an inverter structure provided with a PMOS transistor P14 and an NMOS transistor N14, as illustrated in FIG. 2.

In the conventional BLIT control signal generator of FIG. 2, the boosted voltage VPP is used as the substrate bias voltage even during the stand-by mode, the self-refresh mode, and a mode when the cell array blocks are not selected by the cell array block signal, and the boosted voltage VPP is also applied to a source of the PMOS transistor P14.

However, in the present invention, the boosted voltage VPP is used as the substrate bias voltage during the stand-by mode, the self-refresh mode, and a mode when the cell array blocks are not selected by the cell array block signal, whereas the power supply voltage VDD is applied to the source of the PMOS transistor P14.

In the present invention, the substrate bias voltage, i.e., the boosted voltage VPP, and the power supply voltage VDD are separately used for securing sufficient time when the memory device enters active mode from the stand-by mode, the self-refresh mode and the mode when the cell array blocks are not selected by the cell array block select signals, because the well has large capacitance.

In summary, the two embodiments of the present invention are described above for reducing off leakage current.

First, the selected cell array blocks and the unselected cell array blocks are divided regardless of a specific operational mode of the semiconductor memory device. In this case, the boosted voltage VPP, which is a driving voltage required for operation, is applied to the selected cell array blocks, whereas the power supply voltage VDD lower than the boosted voltage VPP is applied to the unselected memory cell array blocks to reduce the amount of off leakage current.

Second, the operation mode is divided into the active mode and the stand-by mode (or self-refresh mode), and the boosted voltage VPP is applied to all the cell array blocks during the active mode. However, during the stand-by mode (or self-refresh mode), the boosted voltage VPP is only applied to the selected cell array blocks, whereas the power supply voltage VDD lower than the boosted voltage VPP is applied to the unselected memory cell array blocks to reduce the amount of off leakage current.

Therefore, in comparison with the prior art case where the boosted voltage having high voltage level is applied to the cell array blocks which do not operate, the semiconductive memory device of the present invention can reduce the amount of off leakage current by applying the power supply voltage which is lower than the boosted voltage.

As described above, the present invention can reduce the amount of off leakage current caused by the boosted voltage VPP in a semiconductor memory device.

Accordingly, it is possible to reduce the amount of power consumption in the semiconductor memory device, which increases fabrication yield of the semiconductor memory device.

While the present invention has been described with respect to the specific embodiments, it will be apparent to those skilled in the art that various changes and modifications may be made without departing from the spirit and scope of the invention as defined in the following claims.

For example, kinds and configurations of logics used in the aforementioned embodiments have been exemplarily illustrated assuming that all input and output signals are activated at logic high levels. Therefore, the logics may be differently modified in case where activation polarities of the signals are changed. However, since such modified embodiments are too numerous and they can be easily deduced from the aforementioned embodiments of the present invention by those skilled in the art, direct description of them will be omitted herein.

What is claimed is:

1. A semiconductor memory device, comprising:
a plurality of cell array blocks;
a boosted voltage driving unit for selectively supplying a boosted voltage to the cell array blocks, wherein the boosted voltage driving unit comprises
a power supply line connected to the cell array block,
a power supply voltage driver for supplying a power supply voltage to the power supply line, and
a boosted voltage driver for supplying the boosted voltage to the power supply line under control of the controller, wherein the boosted voltage driver comprises a p-type metal oxide semiconductor (PMOS) transistor of which a source is connected to a boosted voltage terminal, a drain is connected to the power supply line, and a gate receives an output signal of the controller; and
a controller controlling a driving operation of the boosted voltage driving unit in response to a cell array block select signal.

2. The semiconductor memory device as recited in claim 1, wherein the controller drives the boosted voltage driving unit in response to a control signal indicating a stand-by mode or a self-refresh mode.

3. The semiconductor memory device as recited in claim 2, wherein the boosted voltage driving unit supplies the boosted voltage to all of the cell array blocks during an active mode and supplies the boosted voltage to only a selected cell array block during the stand-by mode or the self-refresh mode in response to the cell array block select signal and the control signal.

4. The semiconductor memory device as recited in claim 1, wherein the boosted voltage driving unit supplies the boosted voltage to only a selected cell array block in response to the cell array block select signal.

5. The semiconductor memory device as recited in claim 1, wherein the cell array block comprises a bit line isolation transistor (BLIT) control signal generator, the BLIT control signal generator receiving a source power through the boosted voltage driving unit, and the boosted voltage being applied to a well of the BLIT control signal generator without passing through the boosted voltage driving unit.

6. The semiconductor memory device as recited in claim 1, wherein the boosted voltage driving unit comprises a clamping circuit for supplying a clamped voltage lower than the boosted voltage to an unselected cell array block in response to the cell array block select signal.

7. The semiconductor memory device as recited in claim 1, wherein the boosted voltage driving unit comprises a voltage down converter for lowering the boosted voltage to supply the lowered voltage to an unselected cell array block in response to the cell array block select signal.

8. The semiconductor memory device as recited in claim 1, wherein the power supply voltage driver comprises an n-type metal oxide semiconductor (NMOS) transistor of which a source and a gate are commonly connected to a power supply terminal and a drain is connected to the power supply line.

9. A semiconductor memory device, comprising:
a plurality of cell array blocks;
a plurality of power supply lines provided for each of the cell array blocks correspondingly;
a plurality of power supply voltage drivers provided for each of the power supply lines correspondingly to supply a power supply voltage to the power supply lines; and
a plurality of boosted voltage drivers provided for each of the power supply lines correspondingly to supply a boosted voltage to the power supply lines in response to a cell array block select signal,
wherein the boosted voltage driver comprises a PMOS transistor of which a source is connected to a boosted voltage terminal, a drain is connected to the power supply line, and a gate receives a control signal.

10. The semiconductor memory device as recited in claim 9, wherein the cell array block comprises a bit line isolation transistor (BLIT) control signal generator, the boosted voltage being applied to the BLIT control signal generator without passing through the boosted voltage driver.

11. The semiconductor memory device as recited in claim 9, wherein the cell array block comprises a BLIT control signal generator, the BLIT control signal generator receiving a source power through the boosted voltage driver, and the boosted voltage being applied to a well of the BLIT control signal generator without passing through the boosted voltage driver.

12. A semiconductor memory device, comprising:
a plurality of cell array blocks;
a plurality of power supply lines provided for each of the cell array blocks correspondingly;
a plurality of power supply voltage drivers provided for each of the power supply lines correspondingly to supply a power supply voltage to the power supply lines; and
a plurality of boosted voltage drivers provided for each of the power supply lines correspondingly to supply a boosted voltage to the power supply lines in response to a cell array block select signal and a control signal indicating a stand-by mode or a self-refresh mode,
wherein the boosted voltage driver comprises a PMOS transistor of which a source is connected to a boosted voltage terminal, a drain is connected to the power supply line, and a gate receives the control signal.

13. The semiconductor memory device as recited in claim 12, wherein the cell array block comprises a bit line isolation transistor (BLIT) control signal generator, the boosted voltage being applied to the BLIT control signal generator without passing through the boosted voltage driver.

14. The semiconductor memory device as recited in claim 12, wherein the cell array block comprises a BLIT control signal generator, the BLIT control signal generator receiving a source power through the boosted voltage driver, and the boosted voltage being applied to a well of the BLIT control signal generator without passing through the boosted voltage driver.

15. A semiconductor memory device, comprising:

a plurality of cell array blocks;

a plurality of power supply lines provided for each of the cell array blocks correspondingly;

a plurality of power supply voltage drivers provided for each of the power supply lines correspondingly to supply a power supply voltage to the power supply lines;

a plurality of boosted voltage drivers provided for each of the power supply lines correspondingly to supply a boosted voltage to the power supply lines; and a plurality of controllers provided for each of the boosted voltage drivers correspondingly to control driving operations of the boosted voltage, wherein the boosted voltage driver comprises a PMOS transistor of which a source is connected to a boosted voltage terminal, a drain is connected to the power supply line, and a gate receives an output signal of the controller.

16. The semiconductor memory device as recited in claim 15, wherein the controller drives the boosted voltage driver in response to a control signal indicating a stand-by mode or a self-refresh mode.

17. The semiconductor memory device as recited in claim 16, wherein the boosted voltage driver supplies the boosted voltage to only a selected cell array block in response to a cell array block select signal.

18. The semiconductor memory device as recited in claim 17, wherein the boosted voltage driver supplies the boosted voltage to all of the cell array blocks during an active mode and supplies the boosted voltage to only a selected cell array block during the stand-by mode or the self-refresh mode in response to the cell array block select signal and the control signal.

19. The semiconductor memory device as recited in claim 15, wherein the cell array block comprises a bit line isolation transistor (BLIT) control signal generator, the boosted voltage being applied to the BLIT control signal generator without passing through the boosted voltage driver.

20. The semiconductor memory device as recited in claim 15, wherein the cell array block comprises a BLIT control signal generator, the BLIT control signal generator receiving a source power through the boosted voltage driver, and the boosted voltage being applied to a well of the BLIT control signal generator without passing through the boosted voltage driver.

* * * * *